United States Patent [19]

Miura et al.

[11] Patent Number: 4,724,407
[45] Date of Patent: Feb. 9, 1988

[54] INTEGRATED FILTER CIRCUIT HAVING SWITCHABLE SELECTED PARALLEL FILTER PATHS

[75] Inventors: Kuniaki Miura, Ibaraki; Isao Fukushima; Yoshinori Okada, both of Katsuta; Mitsuru Kudo, Yokohama; Takashi Kubota, Mito, all of Japan

[73] Assignee: Hitachi, Ltd., Tokyo, Japan

[21] Appl. No.: 863,244

[22] Filed: May 14, 1986

Related U.S. Application Data

[63] Continuation of Ser. No. 658,023, Oct. 5, 1984, abandoned.

[30] Foreign Application Priority Data

Oct. 7, 1983 [JP] Japan ................... 58-186776

[51] Int. Cl.⁴ ................ H03H 7/065; H03H 11/04
[52] U.S. Cl. ................... 333/17 R; 333/101; 333/103; 333/172; 333/174; 330/51
[58] Field of Search ................... 333/172–174, 333/176, 167, 101, 103, 132, 17 R, 18; 330/51, 107, 109

[56] References Cited

U.S. PATENT DOCUMENTS

| | | | |
|---|---|---|---|
| 3,411,098 | 11/1968 | Perra | 330/290 |
| 3,533,020 | 10/1970 | Hecht | 333/17 |
| 3,582,835 | 6/1971 | Walding | 333/174 |
| 3,611,154 | 10/1971 | Kupfer | 455/180 |
| 3,742,395 | 6/1973 | Yoneyoma | 333/17 |
| 4,197,515 | 4/1980 | Hornfeldt et al. | 333/173 X |
| 4,302,738 | 11/1981 | Cabot et al. | 333/174 |
| 4,319,207 | 3/1982 | Gignoux | 333/173 |
| 4,378,538 | 3/1983 | Gignoux | 333/173 |
| 4,480,338 | 10/1984 | Dobiovolny | 333/103 X |

FOREIGN PATENT DOCUMENTS

| 0109795 | 5/1984 | European Pat. Off. ............ 333/172 |
| 1923893 | 11/1970 | Fed. Rep. of Germany ...... 333/173 |

OTHER PUBLICATIONS

Electronics Letters, vol. 17, No. 12, 11th Jun. 1981, pp. 406–407; Longdon, GB; Y. Tsividis: "Self-Tuned Filters".

Electronic Components and Applications, vol. 2, No. 1, Nov. 1979, pp. 16–26, Eindhoven, NL; E. A. Kilian: "Part 5—DC-Controlled Audio Switches and Filters".

Primary Examiner—Eugene R. LaRoche
Assistant Examiner—Benny Lee
Attorney, Agent, or Firm—Antonelli, Terry & Wands

[57] ABSTRACT

An integrated filter circuit including at least integrated resistances and integrated capacitances, said integrated filter circuit comprising a plurality of filter circuits connected in parallel and in which at least either resistance values or capacitance values are different, a switch for switching said parallel filter circuits, and means for controlling said switch to select one of said parallel filter circuits.

6 Claims, 17 Drawing Figures

FIG. 12
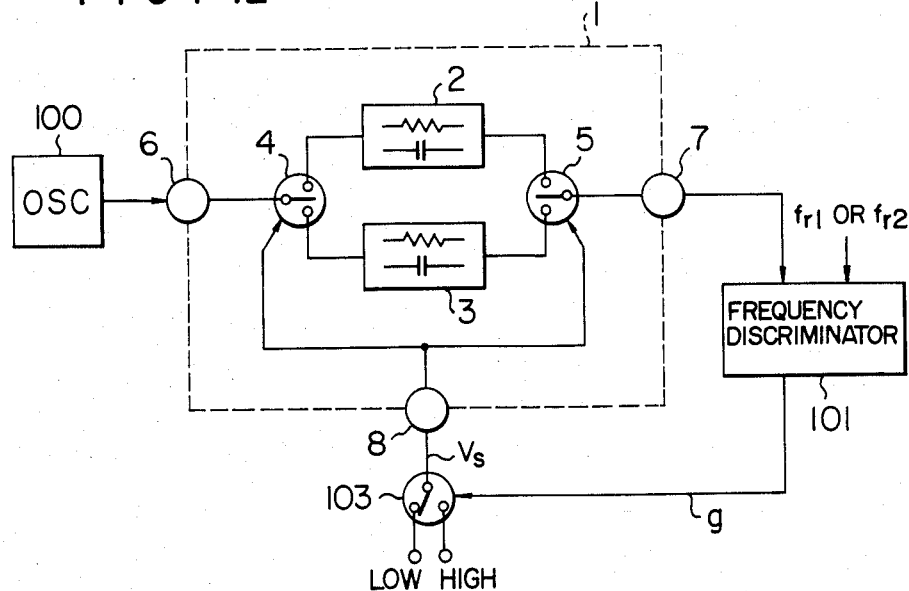
FIG. 13
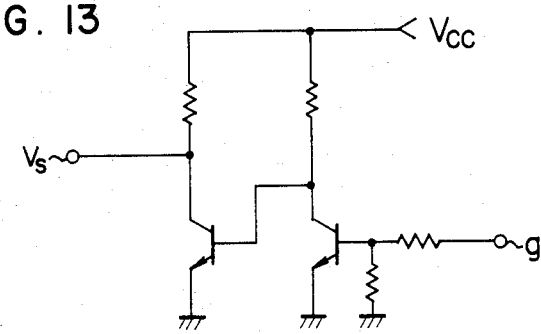
FIG. 14a            FIG. 14b
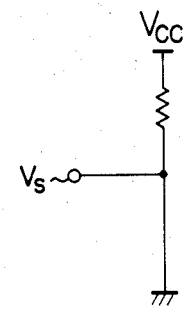    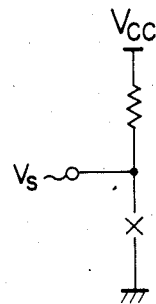

INTEGRATED FILTER CIRCUIT HAVING SWITCHABLE SELECTED PARALLEL FILTER PATHS

This is a continuation of application Ser. No. 658,023, filed Oct. 5, 1984, now abandoned.

This invention relates to an integrated filter circuit suitable to be formed within a monolithic integrated circuit (monolithic IC) on a silicon wafer or the like.

As the degree of the integration of electric circuits (monolithic IC, or hereinafter simply abbreviated IC) is advanced, it has become important to achieve the integration of discrete block filters for the production of small and low-cost circuits. Most of the filters that have been used so far are formed of inductances, capacitances and resistances. Since the inductance is difficult to integrate, active filters that can be formed of only capacitance C and resistance R are suitable for being formed as ICs. FIG. 1 shows a prior art trap filter known as a Twin-T. In FIG. 1, if the resistances R1, R2 and R3 and capacitances C1, C2 and C3 are selected to have the relation given as $$R1 = R2 = 2R3 = R$$
$$C1 = C2 = C3/2 = C,$$

the trap frequency fr can be expressed by $$f_r = 1/2\pi CR \quad (1)$$

In FIG. 1, $v_i$ represents an input signal and $v_o$ is an output signal.

When forming a filter of such a construction as an IC, a problem of scattering is encountered. That is, the values of the capacitances and resistances within the IC are scattered by the irregular impurity concentration within the semiconductor and misregistration of masks. For example, the value of capacitance C and that of resistance R have great variations within ±20% and ±15% of desired value, respectively. Therefore, the trap frequency of the trap filter of FIG. 1 changes within the range from $a(f_r)$ to $b(f_r')$ as shown in FIG. 2. In the worst case, the trap frequency $f_r$ deviates ±35%, which makes it extremely difficult to achieve a required filter characteristic. To overcome this difficulty, the resistances on the IC chip are adjusted in value by laser trimming so that the scattering of resistance can be absorbed. This method, however, cannot solve the problems of precision, yield rate and so on.

Accordingly, it is an object of this invention to provide an integrated filter circuit capable of absorbing the scattering of the integrated capacitances and resistances and which assures good performance by obviating the above-mentioned defects.

In order to achieve the object of the invention, there is provided an integrated filter circuit comprising a plurality of parallel-connected filter circuits each including resistances and capacitances in which at least either the resistances or the capacitances have different values, and means for selecting one of the parallel-connected filters whereby the scattering of the integrated capacitances and resistances can be absorbed. In addition, the use of variable capacitance diodes for the integrated capacitances can extend the range of absorbing the scattering and raise the precision.

The present invention will be apparent from the following detailed description taken in conjunction with the accompanying drawings, in which:

FIG. 12 is a block diagram of an example of a switching circuit of the filter circuit according to this invention; and FIGS. 13, 14a, 14b, 15 and 16 are circuit diagrams of specific examples of the switching circuit.

Figure 1:
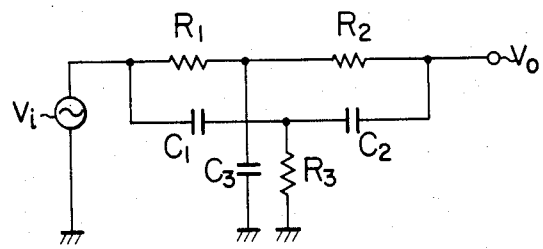
FIG. 1 is a circuit diagram of a prior art Twin-T type trap filter.
Figure 2:
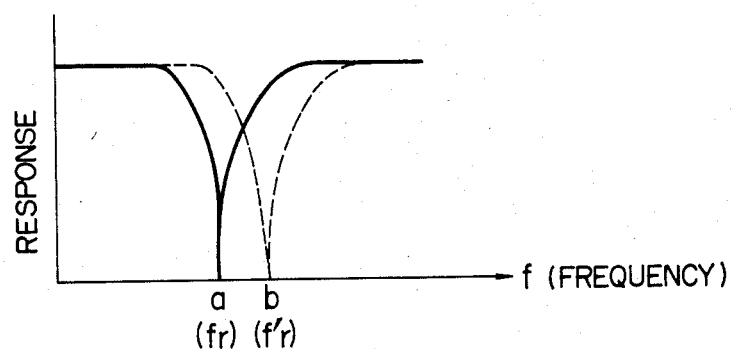
FIG. 2 is a graph of characteristic curves showing the scattering of the prior art trap frequency.
Figure 3:
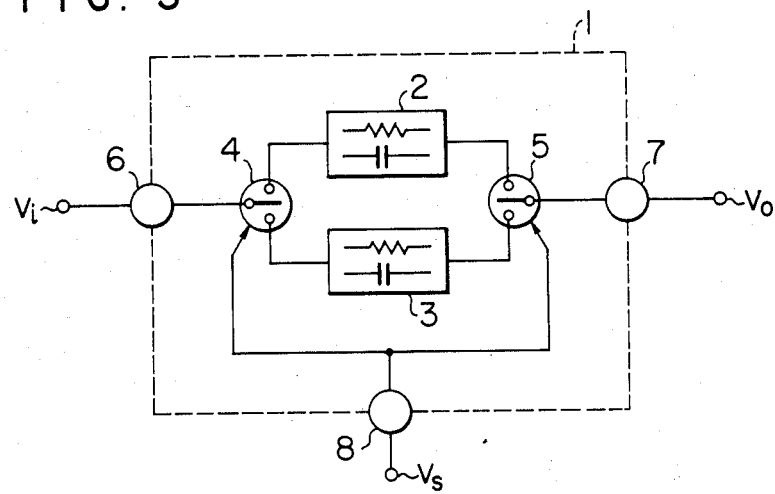
FIG. 3 is a block diagram of one embodiment of this invention.

One embodiment of this invention will be described with reference to FIG. 3 which is a block diagram of one embodiment of the invention. Referring to FIG. 3, there are shown two similar filters 2 and 3 each of which includes at least resistors R and capacitors C but are different at least in the values of either resistors R or capacitors C. Shown at 4 and 5 are switching circuits which are respectively provided before and after the filters 2 and 3. The switching circuits 4 and 5 are supplied with a control signal $v_s$ from a control pin 8 so that one of the filters 2 and 3 is selected by switching. The switching circuits 4 and 5 are each formed of, for example, a transistor switching circuit. All the filter circuits 2 and 3 and switching circuits 4 and 5 are formed as a single integrated circuit (IC) 1. Shown at 6 and 7 are signal input and output pins of the IC 1. An input signal $v_i$ applied to the input pin 6 is fed through the switching circuit 4, the filter 2 and the switching circuit 5 or through the switching circuit 4, the filter 3 and the switching circuit 5 to the output pin 7, at which an output signal $v_o$ appears.

Figure 4:
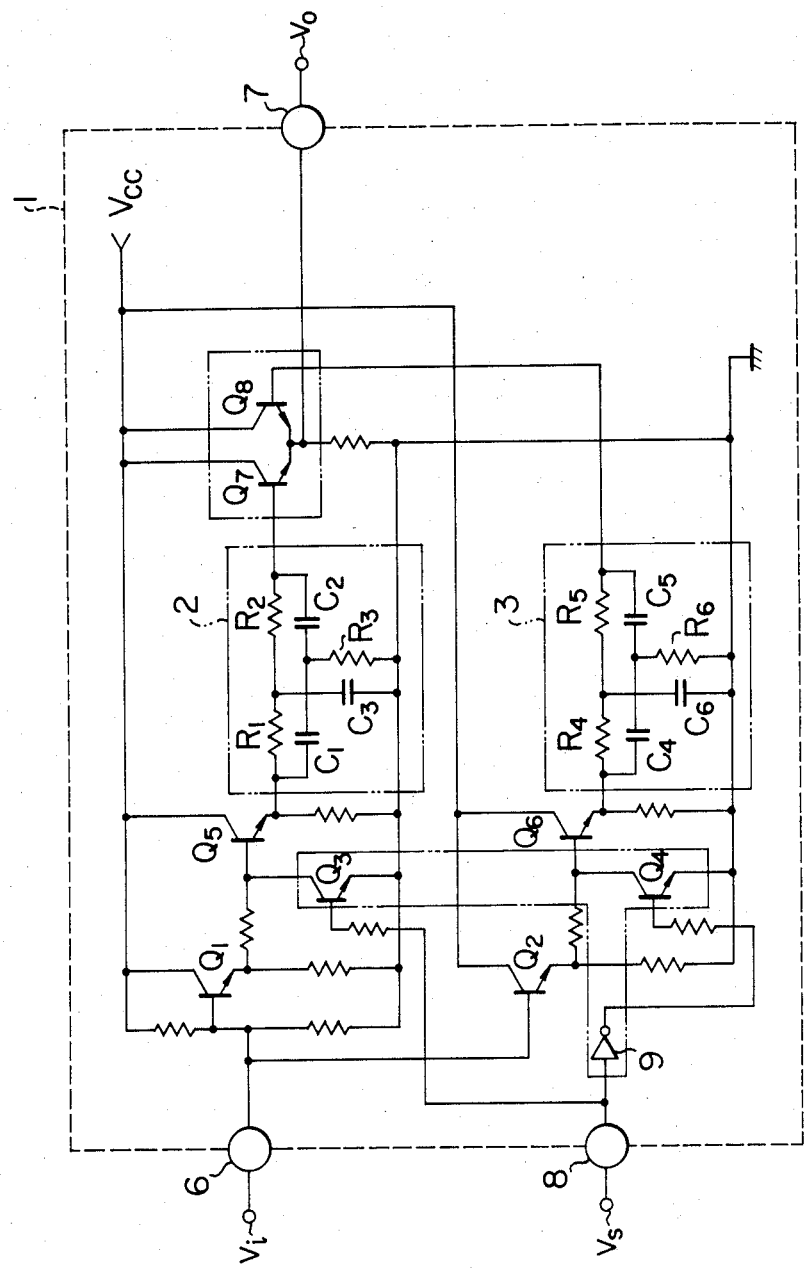
FIG. 4 is a circuit diagram of a specific example of FIG. 3.

FIG. 4 is a circuit diagram of a specific example of the IC 1 shown in FIG. 3. In FIG. 4, the filters 2 and 3 are Twin-T type filters. The filter 2 includes resistors R1, R2 and R3 and capacitors C1, C2 and C3 of which the relative values are selected as $$\left. \begin{array}{l} R1 = R2 = 2R3 = R \\ C1 = C2 = C3/2 = C \end{array} \right\} \quad (2)$$

$$f_{r1} = \frac{1}{2\pi CR} \quad (3)$$

The filter 3 includes resistors R4, R5 and R6 and capacitors C4, C5 and C6 of which the relative values are selected as $$\left. \begin{array}{l} R4 = R5 = 2R6 = R' \\ C4 = C5 = C6/2 = C' \end{array} \right\} \quad (4)$$

-continued $$f_{r2} = \frac{1}{2\pi C'R'}$$

The resistances R and R' and capacitances C and C' may take on any value. The conditions of expressions (2) and (4) can be realized with the precision of ±1% in the IC. In FIG. 4, the switching circuit 4 in FIG. 3 corresponds to the block including transistors Q3 and Q4 and an inverter 9 and the switching circuit 5 in FIG. 3 corresponds to the block including transistors Q7 and Q8. With the arrangement of FIG. 4, when the control signal $v_s$ is high voltage level, the transistor Q3 is turned on and the transistor Q4 is turned off with the result that the input signal $v_i$ is supplied through the transistors Q2 and Q6 to the filter 3. At this time, since the base potential of the transistor Q7 is lower than that of the transistor Q8, the transistor Q7 is turned off and the transistor Q8 is turned on, the output of the filter 3 appearing at the pin 7 as $v_o$. When the control signal $v_s$ is low voltage level, the output of the filter 2 appears at the pin 7 as $v_o$. When the control signal $v_s$ is low level, the transistor Q3 is turned off and the transistor Q4 is turned on with the result that the input signal $v_i$ is supplied through the transistors Q1 and Q5 to filter 2.

Figure 5:
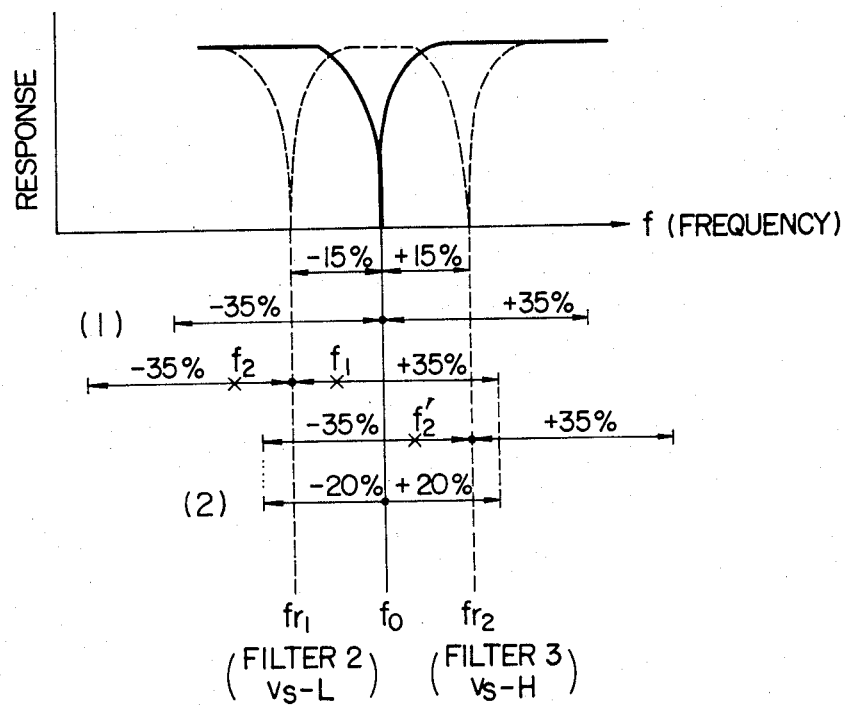
FIG. 5 is a diagram useful for explaining the absorption of the scattering of the trap frequency.

If, now, the trap frequency $f_{r1}$ of the filter 2 is selected to be 15% lower than a desired value $f_o$, the trap frequency $f_{r2}$ of the filter 3 to be 15% higher than the value $f_o$ as shown in FIG. 5, and either of the filters 2 and 3 is selected as follows, then the scattering can be limited to $f_o \pm 20\%$.

That is, when the trap frequency $f_{trap}$ is larger than the center value (trap frequency) $f_{r1}$ of the filter 2, or $f_{trap} < f_{r1}$, the filter 2 is selected, when the trap frequency $f_{trap}$ is lower than the center value (trap frequency) $f_{r1}$ of the filter 2, or $f_{trap} \leq f_{r1}$, the filter 3 is selected. The way to select either of the filters 2 and 3 is, for example, shown in FIG. 12. That is, in FIG. 12, an oscillator 100 is connected to the input signal pin 6, a voltage level changing switch 103 to the control pin 8, and a frequency discriminator 101 between the output signal pin 7 and the switch 103. The switch 103 is responsive to an output g from the frequency discriminator 101 to change to the fixed low-level side position for its low voltage level or to the fixed high-level side position for its high voltage level. At initial setting, when the output g is low voltage level, or the control signal $v_s$ is low voltage level, the filter 2 is selected.

The switch 103 is constructed as, for example, shown in FIG. 13. In addition, it is possible as shown in FIGS. 14a and 14b, that when the control signal g is low level, the control signal $v_s$ is low as shown in FIG. 14a, and when the control signal g is high level, the portion of X is initially cut off by a laser (not shown) to make the control signal $v_s$ at high level as shown in FIG. 14b, where $V_{cc}$ represents a power supply.

With the arrangement of FIG. 12, when the frequency of the oscillator 100 is changed, such that a filter characteristic of the trap frequency is present in the range of $f_{r1} \pm 35\%$ is obtained at the output pin 7. This trap frequency $f_{trap}$ is compared with the center value $f_{r1}$ of the filter 2 in the frequency discriminator 101. The frequency discriminator 101 then produces the compared output, or control signal g of low voltage level for $f_{trap} > f_{r1}$ or of high voltage level for $f_{trap} \leq f_{r1}$. When the signal g is the low voltage level, the switch 103 is set to the low level side position so that the control signal $v_s$ is low voltage level to select the filter 2 as in the initial setting.

When the control signal g is high voltage level, the switch 103 is changed to the high level side position so that the control signal $v_s$ is high voltage level to select the filter 3. For example, as shown in FIG. 5, when $f_{trap} = f_1$, the filter 2 is selected, and the trap frequency of the output $v_o$ is $f_1$, while when $f_{trap} = f_2$, the filter 3 is selected and the trap frequency of the output $v_o$ is $f_2'$. The frequencies $f_1$ and $f_2'$ are thus within the range of target value $f_o \pm 20\%$.

The filter 2 having a center value trap frequency of $f_{r1}$ is selected by the switch 5. Then a determination is made by the discriminator 101 whether or not the real trap frequency $f_{trap}$ of the filter is larger than $f_{r1}$ as determined. If $f_{trap} \geq f_{r1}$, the filter 2 is selected as it is and if $f_{trap} < f_{r1}$ the filter 3 is selected whereby $f_{trap}$ is changed from $f_2$ and $f_2'$. For example when $f_{trap}$ is lower by 10% than $f_{r1}$ due to scattering of capacitance and resistance values, the trap frequency becomes a value $f_2'$ which is lower by 10% than the center value $f_{trap}$ of the filter by selecting the filter 3.

Similarly $f_{trap}$ is compared with the center value $f_{r2}$ of the second filter 3 in the frequency discriminator 101. The discriminator outputs a low signal when $f_{trap} \geq f_{r2}$ to choose filter 2 and a high level signal when $f_{trap} < f_{r2}$ to choose filter 3. After the comparison of $f_{trap}$ with both the frequencies $f_{r1}$ and $f_{r2}$ is complete, the switch 5 selects the filter 2 or 3 which has a filter characteristic that is nearer to the desired filter characteristic.

In order to increase the precision, it is necessary to increase the number of filters to be provided in parallel. In this case, however, the number of elements within the IC is increased, resulting in high cost.

Figure 7:
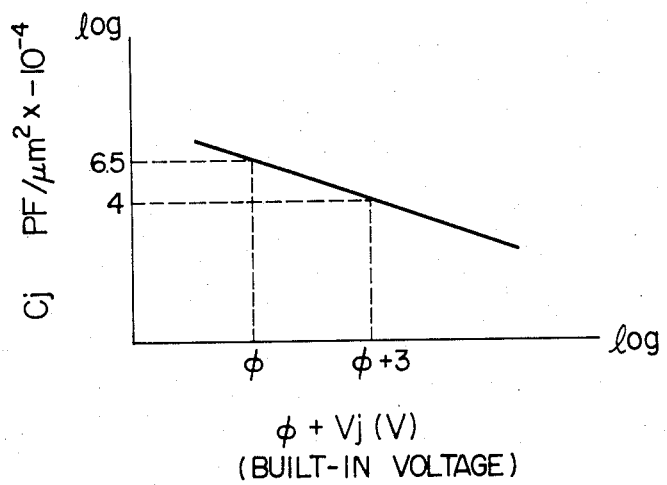
FIG. 7 is a graph of one example of the variable capacitance diode characteristic.
Figure 6:
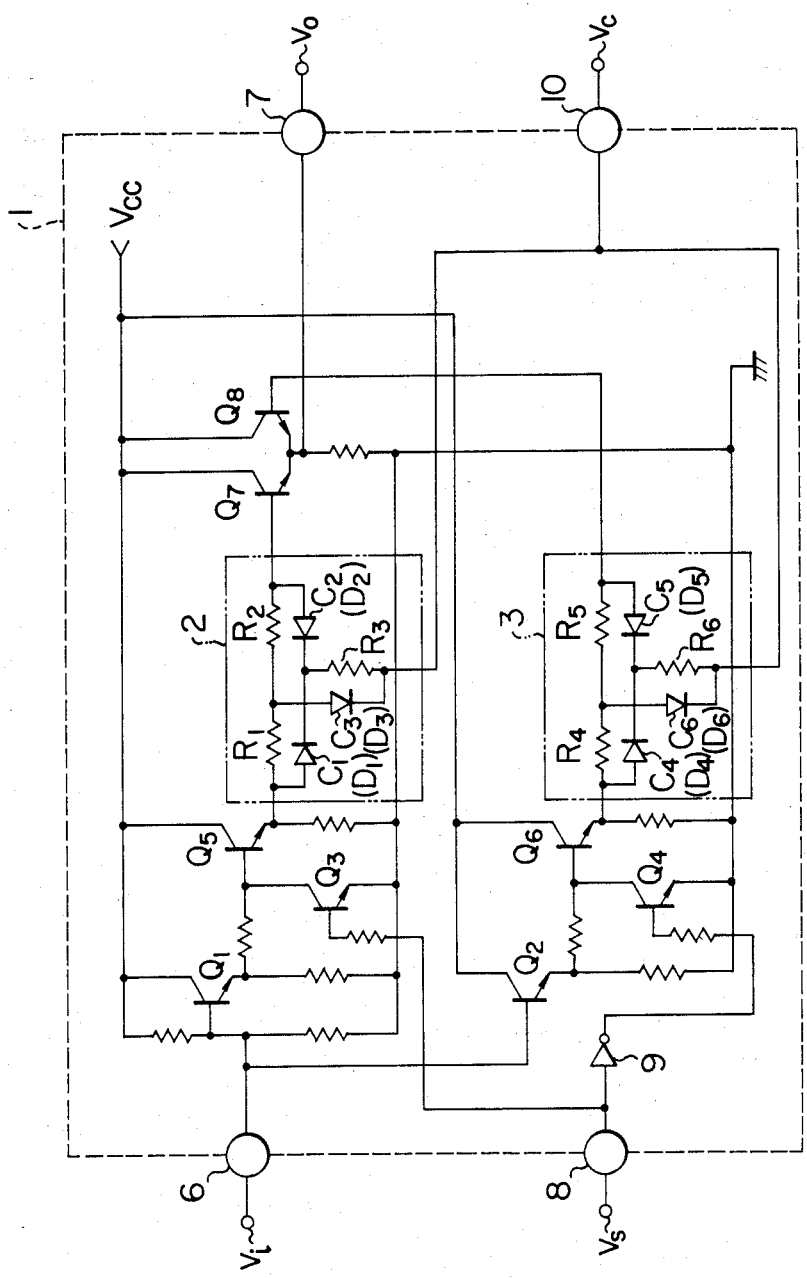
FIG. 6 is a circuit diagram of another embodiment of this invention.

Thus, as shown in FIG. 6, it is extremely effective to form the capacitors C1 to C6 by variable capacitance diodes D1 to D6. Since pairs of elements can be formed with high precision within the IC, the voltage to be applied to the variable capacitance diodes D1 to D6 to be used for a plurality of filters can be changed by a single control voltage $v_c$. Shown at 10 is an IC pin through which the voltage $v_c$ is applied. In the example of FIG. 6, the anode side potentials of the variable capacitance diodes D1 to D6 are set to be equal to the emitter voltage of the transistor Q5 or Q6, and the cathode side potentials $v_c$ thereof are changed to change the voltages across the variable capacitance diodes, and hence the values of the capacitors C1 to C6. The base-emitter capacitances of the variable capacitance diodes can be expressed as $$C_j = \frac{C_j(O)}{\left(1 + \frac{V_j}{\Phi}\right)^{\alpha}};$$

$$= C_j(O)\Phi^{\alpha} \cdot \frac{1}{(1 + V_j)^{\alpha}}$$

$$\log C_j = K - a \log (\Phi + V_j)$$

where
$C_j$: base-emitter junction capacitance
$C_j(O)$: base-emitter junction capacitance when Vj is zero
$V_j$: emitter-base voltage (diode reverse-biasing voltage)
$\Phi$: built-in voltage
$\alpha$: voltage-dependence coefficient K: log $[C_j(O)\Phi^\alpha]$ FIG. 7 shows an example of the characteristic. When the source voltage is selected to be 5 V, then the $V_j$ can take a value in the range from 0 to 3 V, and $C_j$ can be changed within the range of typical value ±20%. Thus, all the scattering of the capacitance C and resistance R can be absorbed by using the variable capacitance diodes.

Figure 8:
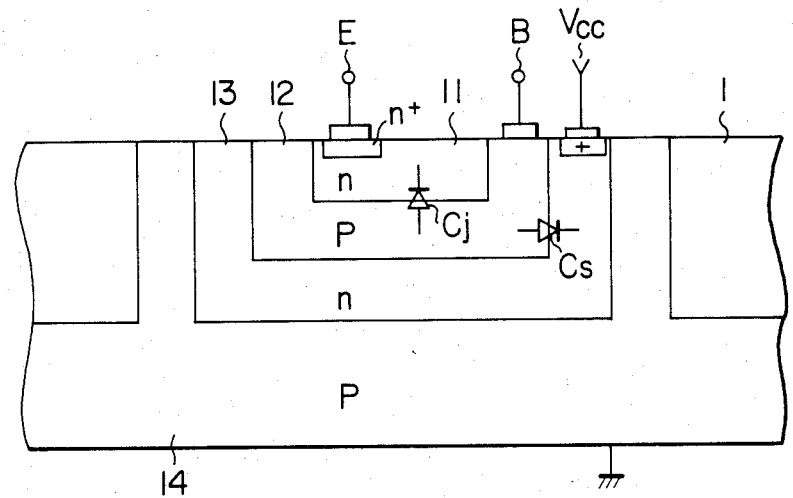
FIGS. 8 and 9 are diagrams useful for explaining the construction of the variable capacitance diode.
Figure 9:
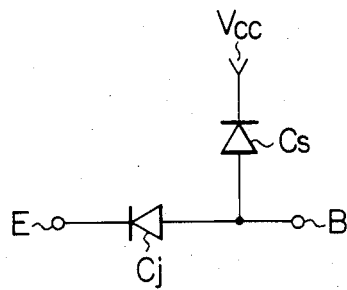

FIG. 8 is a cross-sectional diagram of the IC, using base-emitter junction capacitances for variable capacitance diodes. In FIG. 8, n represents an n-type semiconductor (silicon) and P a p-type semiconductor (silicon). The n+ region is heavily doped to get a good contact between the semiconductor and an external point like an emitter or a terminal $V_{cc}$. Numeral 11 represents an emitter, 12 a base, 13 a collector and 14 a substrate. Since the collector 13 is connected to the power supply, a capacitance $C_s$ is present between the base 12 and the power supply in addition to the capacitance $C_j$ as shown in FIG. 9. Only the capacitance $C_j$ can be used as a variable capacitance diode, and the capacitance $C_s$ is necessary to be as small as possible relative to the capacitance $C_j$.

Figure 10:
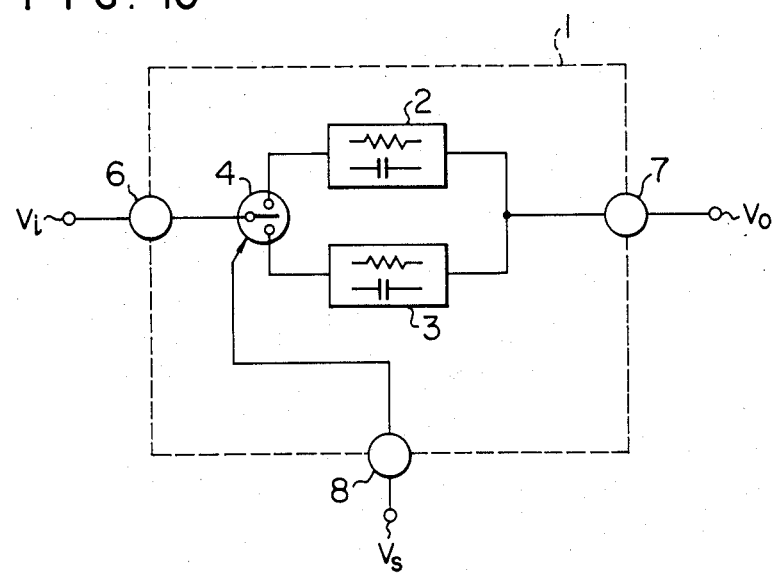
FIGS. 10 and 11 are block diagrams of other embodiments of this invention.
Figure 11:
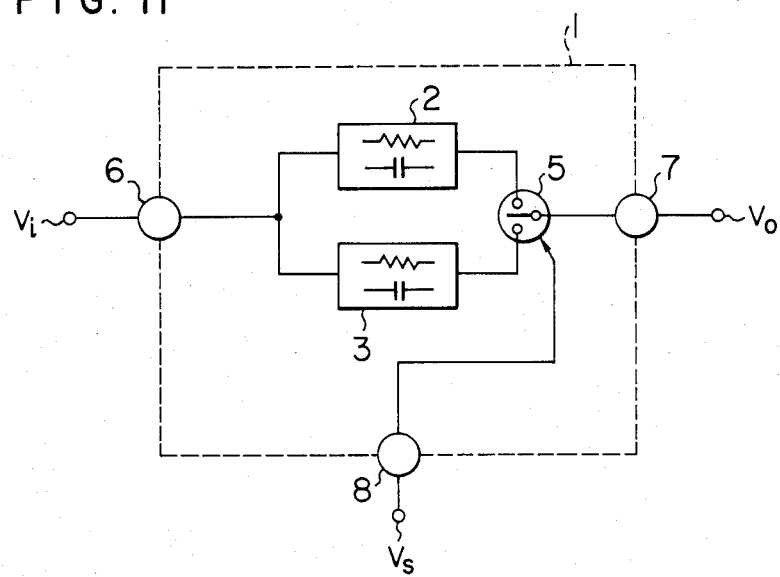

FIGS. 10 and 11 show other embodiments of this invention. These embodiments are different from the embodiment of FIG. 3 in that only the switching circuit 4 is used in FIG. 10 and that only the switching circuit 5 is used in FIG. 11. Also in these cases, a signal passed through either filter 2 or filter 3 can be produced as the output $v_o$.

Figure 15:
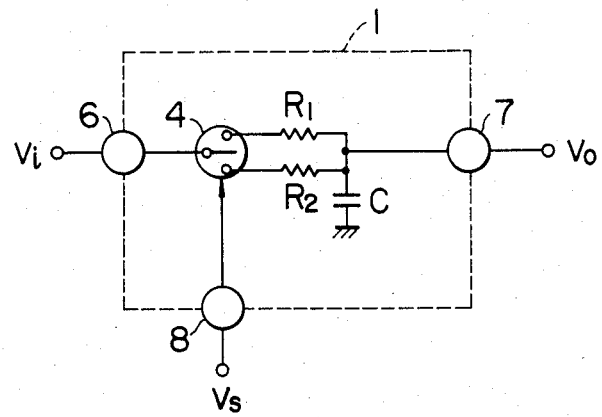
Figure 16:
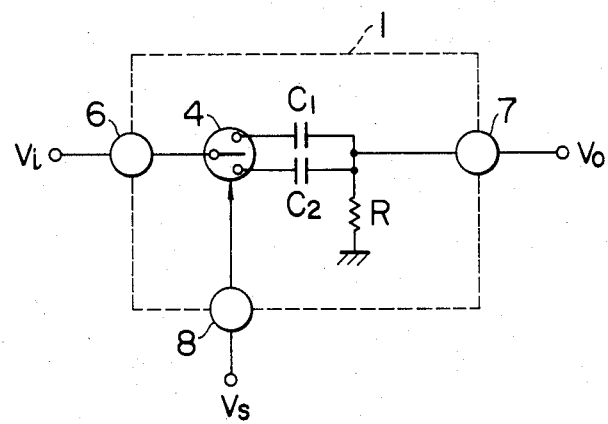

FIGS. 15 and 16 show other embodiments of this invention is which the filter characteristics are changed by switching over resistors or capacitors by means of the switching circuit 4. Further, resistor and capacitor switching may be jointly used for the change of filter characteristic. A variable capacitance element may be used as the capacitor.

While in the above embodiments the base-emitter junction capacitance is used as a variable capacitance diode, the base-collector junction capacitance, collector-substrate junction capacitance and so on can be used as variable-capacitance diodes.

As described above, the scattering of the filter characteristics due to the scattering of the elements of an IC can be absorbed by providing a plurality of parallel filter circuits of resistances and capacitances in which at least either resistances or capacitances are different in values and switching means for switching these parallel filter circuits, or by providing a single filter circuit and switching resistors or capacitors in the filter circuit by a switch, and by using the base-emitter junction capacitances as variable capacitance diodes within the IC. This invention can be applied not only to the trap filter mentioned in the above embodiments but also to all types of filters formed by resistors and capacitors.

According to the embodiments of the invention, a large-sized block filter which has been used as a discrete component so far can be formed as an IC, thus leading to low-cost and small-sized circuits and small number of parts to be used.

We claim:

1. An integrated filter circuit having at least integrated resistors and integrated capacitors comprising:
    (a) a first filter having an input and an output, a desired first center characteristic frequency $f_{r1}$, and an actual first center characteristic frequency which is determined by first resistance and first capacitance values respectively of said integrated resistors and integrated capacitors, said values of first resistance and first capacitance being subject to variation from a desired value;
    (b) a second filter having an input and an output, a desired second center characteristic frequency $f_{r2}$, and an actual second center characteristic frequency which is determined by second resistance and second capacitance values respectively of said integrated resistors and integrated capacitors, said values of second resistance and second capacitance being subject to variation from a desired value;
    (c) filter switching means, coupled to at least one of the input and output of said first and second filters, for selecting the first filter when the actual center characteristic frequency of the first filter is higher than the frequency $f_{r1}$ or the actual center characteristic frequency of the second filter is higher than $f_{r2}$ and for selecting the second filter when the actual center charcteristic frequency of the first filter is lower than $f_{r1}$ or the actual center characteristic frequency of the second filter is lower than $f_{r2}$; and
    (d) means for varying the actual center characteristic frequency of the filter selected by the filter switching means by varying a variable capacitance diode means to obtain a desired characteristic frequency.

2. An integrated filter circuit according to claim 1, wherein said first and second filters include control circuits coupled to said first and second variable capacitance diode means to apply a control voltage for changing capacitance values of said first and second variable capacitance diode means, respectively.

3. An integrated filter circuit in accordance with claim 1 wherein said filter switching means includes:
    (a) switching means for connecting an input of said filter circuit and an output of said filter circuit respectively to the input and output to one of said first and second filters;
    (b) frequency discriminating means, coupled to the output of said filter circuit, for comparing the actual center characteristic frequency of the first filter with $f_{r1}$ and for producing the control signal having a first magnitude when the actual center characteristic frequency is $\geq f_{r1}$ and having a second magnitude when the actual center characteristic is $< f_{r1}$; and
    (c) means, coupled to an output of said frequency discriminating means and responsive to the magnitude of the control signal, for causing the selection of the first filter when the control signal is of the first magnitude and for causing the selection of the second filter when the control signal is of the second magnitude.

4. An integrated filter circuit in accordance with claim 1 wherein said filter switching means includes:
    (a) switching means for connecting an input of said filter circuit and an output of said filter circuit respectively to the input and output to one of said first and second filters;
    (b) frequency discriminating means, coupled to the output of said filter circuit, for comparing the actual center characteristic frequency of the second filter with $f_{r2}$ and for producing the control signal, the control signal having a first magnitude when the actual center characteristic frequency is $\geq f_{r2}$ and a second magnitude when the actual center characteristic frequency $< f_{r2}$; and (c) means, coupled to an output of said frequency discriminating means and responsive to the magnitude of the control signal, for causing the selection of the first filter when the control signal is of the first magnitude and for causing the selection of the second filter when the control signal is of the second magnitude.

5. An integrated filter circuit comprising:
(a) an input terminal supplied with an input signal;
(b) an output terminal providing an output signal;
(c) filter circuit means connected between said input terminal and output terminal to receive said input signal and provide said output signal, said filter circuit means comprising an integrated circuit having a desired filter characteristic with an actual center characteristic frequency f, said filter circuit means having
  (i) a first filter circuit having a desired center characteristic frequency $f_{r1}$, an input and an output, and first resistor means and first capacitance diode means, said first resistance means and first capacitance diode means respectively having first resistance and first capacitance values providing an actual first center characteristic frequency; and
  (ii) a second filter circuit having a desired center characteristic frequency $f_{r2}$, an input and an output, and second resistor means and second capacitance diode means, said second resistor means and second capacitance diode means respectively having second resistance and second capacitance values providing an actual second center characteristic frequency;
(d) filter selecting means, coupled to at least one of the inputs or outputs of said first and second filters for selectively connecting one of said first and second filter circuits with said input terminal or output terminal, said filter selecting means including switching means wherein under a first filter circuit selecting condition, said switching means selects said second filter circuit when the actual center characteristic frequency of said first filter is less than $f_{r1}$ and under a second filter selecting condition, said switching means selects said first filter when the actual center characteristic frequency of said second filter circuit is equal to or greater than $f_{r2}$;
(e) adjusting means, connected to said first and second variable capacitance diode means of said first and second filter circuits, for changing capacitance values of said variable capacitance diode means; and
(f) wherein said switching means selects the one of said first and second filter circuits having a center characteristic frequency closer to f than the center frequency characteristic frequency of the other filter and said adjusting means adjusts said capacitance value of said variable capacitance diode means of the selected one of the first and second filter circuits to obtain said actual characteristic frequency f.

6. An integrated filter circuit in accordance with claim 5 wherein said switching means comprises:
frequency discriminating means coupled to the output terminal for discriminating between an actual frequency and a desired frequency by comparing the actual center characteristic frequency of said first and second filter circuits with the desired center characteristic frequency; and
a switching circuit for receiving an output from said frequency discriminating means for selecting said filter circuit in accordance with the output of said frequency discriminating means.

* * * * *